(12) United States Patent
Farris, III et al.

(10) Patent No.: US 8,941,132 B2
(45) Date of Patent: Jan. 27, 2015

(54) APPLICATION SPECIFIC SOLAR CELL AND METHOD FOR MANUFACTURE USING THIN FILM PHOTOVOLTAIC MATERIALS

(75) Inventors: Chester A. Farris, III, Yorba Linda, CA (US); Albert S. Brown, San Jose, CA (US)

(73) Assignee: Stion Corporation, San Jose, CA (US)

( * ) Notice: Subject to any disclaimer, the term of this patent is extended or adjusted under 35 U.S.C. 154(b) by 1092 days.

(21) Appl. No.: 12/958,250

(22) Filed: Dec. 1, 2010

(65) Prior Publication Data

US 2011/0071659 A1    Mar. 24, 2011

Related U.S. Application Data

(63) Continuation of application No. 12/509,136, filed on Jul. 24, 2009, now Pat. No. 7,855,089.

(60) Provisional application No. 61/095,939, filed on Sep. 10, 2008.

(51) Int. Cl.
*H01L 21/32* (2006.01)
*H01L 27/144* (2006.01)

(52) U.S. Cl.
CPC ........ *H01L 27/1443* (2013.01); *H01L 27/1446* (2013.01)
USPC ............................... 257/89; 257/92; 716/120

(58) Field of Classification Search
CPC .............. H01L 21/268; H01L 21/1425; H01L 21/76254; H01L 24/95; H01L 31/1832; H01L 31/02167; H01L 31/022425
USPC ................. 716/111, 120; 257/89–92
See application file for complete search history.

(56) References Cited

U.S. PATENT DOCUMENTS

| 3,520,732 A | 7/1970 | Nakayama et al. |
| 3,828,722 A | 8/1974 | Reuter et al. |

(Continued)

FOREIGN PATENT DOCUMENTS

| AU | 1998/78651 | 2/1999 |
| AU | 2001/45099 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Michael Lebentritt
(74) *Attorney, Agent, or Firm* — Kilpatrick Townsend & Stockton LLP

(57) ABSTRACT

A method for manufacture of application specific solar cells includes providing and processing custom design information to determine at least a cell size and a cell shape. The method includes providing a transparent substrate having a back surface region, a front surface region, and one or more grid-line regions overlying the front side surface region. The one or more grid regions provide one or more unit cells having the cell size and the cell shape. The method further includes forming a layered structure including photovoltaic materials overlying the front surface region. Additionally, the method includes aligning a laser beam from the back surface region to illuminate a first region within the one or more grid-line regions, subjecting a first portion of the layered structure overlying the first region to the laser beam to separate the first portion of the layered structure from the first region, and scanning the laser beam along the one or more grid-line regions to cause formation of one or more unit cells having the cell size and cell shape. The method further includes transferring the one or more unit cells.

12 Claims, 9 Drawing Sheets

(56) References Cited

U.S. PATENT DOCUMENTS

| | | |
|---|---|---|
| 3,975,211 A | 8/1976 | Shirland |
| 4,062,038 A | 12/1977 | Cuomo et al. |
| 4,263,336 A | 4/1981 | Thompson et al. |
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,925,228 A | 7/1999 | Panitz et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,288,325 B1 | 9/2001 | Jansen et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,546,535 B1 * | 4/2003 | Nagao et al. .................. 716/120 |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,026,122 B1 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 8,381,156 B1 * | 2/2013 | Beakes et al. .................. 716/110 |
| 2002/0002992 A1 | 1/2002 | Kariya et al. |
| 2002/0004302 A1 | 1/2002 | Fukumoto et al. |

(56) References Cited

U.S. PATENT DOCUMENTS

| | | |
|---|---|---|
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1 | 8/2004 | Miyakawa |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0240989 A1 | 9/2012 | Ramanathan et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "$CuInS_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

(56) References Cited

OTHER PUBLICATIONS

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of $CuInS_2$ Thin Films Solar Cells with Large Grain, Elsevier Science B.V; Solar Energy Materials & Solar Cells 69 (2001) pp. 261-269.

Salvador, "Hole diffusion length in $n$-$TiO_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15 1996, pp. 377-379.

\* cited by examiner

APPLICATION SPECIFIC SOLAR CELL AND METHOD FOR MANUFACTURE USING THIN FILM PHOTOVOLTAIC MATERIALS

CROSS-REFERENCE TO RELATED APPLICATIONS

This application claims priority to U.S. Provisional Patent Application No. 61/095,939, filed Sep. 10, 2008, entitled "APPLICATION SPECIFIC SOLAR CELL AND METHOD FOR MANUFACTURE USING THIN FILM PHOTOVOLTAIC MATERIALS" by inventors Chester A. Farris III and Albert Brown, commonly assigned and incorporated by reference herein for all purposes.

This application is a continuation application of U.S. Non-Provisional patent application Ser. No. 12/509,136, filed Jul. 24, 2009, entitled "APPLICATION SPECIFIC SOLAR CELL AND METHOD FOR MANUFACTURE USING THIN FILM PHOTOVOLTAIC MATERIALS" by inventors Chester A. Farris III and Albert Brown, commonly assigned and incorporated by reference herein for all purposes.

BACKGROUND OF THE INVENTION

The present invention relates generally to photovoltaic materials. More particularly, the present invention provides a method and system for design and manufacture of a solar module using a laser separation process for forming one or more unit cells from continuous layered structure of photovoltaic materials. Merely by way of example, the present method and structure have been implemented to an application specific thin film solar cell having single or multi-junction photovoltaic materials, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles, Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. There have been attempts to form hetero junction cells using a stacked configuration. Although somewhat successful, it is often difficult to match currents between upper and lower solar cells. Furthermore, solar cells often come in standard designs and are often difficult to customize, which is a further limitation. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

The present invention relates generally to photovoltaic materials. More particularly, the present invention provides a method and system for design and manufacture of a solar module using a laser separation process for forming one or more unit cells from continuous layered structure of photovoltaic materials. Merely by way of example, the present method and structure have been implemented to manufacture application specific thin film solar cells having single or multi junction photovoltaic materials, but it would be recognized that the invention may have other configurations.

In a specific embodiment, the present invention provides a method for manufacture of application specific unit cells from thin film photovoltaic devices. The method includes providing design information for application specific unit cells and processing the design information to determine at least a cell size and a cell shape. The method further includes providing a transparent substrate having a thickness, a back surface region, a front surface region, and one or more grid-line regions formed overlying the front side surface region. The one or more grid regions are configured to provide one or more unit cells having the cell size and the cell shape. Additionally, the method includes forming a layered structure including one or more films of photovoltaic materials overlying the front surface region of the transparent substrate. Furthermore, the method includes performing at least one or more processes comprising aligning a laser beam from the back surface region through the thickness of the transparent substrate to illuminate a first region within the one or more grid-line regions, subjecting a first portion of the layered structure overlying the first region to absorbed energy from the laser beam to separate the first portion of the layered structure from the first region, and scanning the laser beam from the first region to a second region along the one or more grid-line regions to cause formation of one or more unit cells having the cell size and cell shape. Moreover, the method includes transferring the one or more unit cells having the cell size and the cell shape. In an alternative embodiment, the method includes interconnecting the one or more unit cells electrically in series or in parallel based on custom requirement. In yet another embodiment, the method includes assembling the interconnected one or more unit cells to form a custom solar module.

In another specific embodiment, the present invention provides a method for manufacture of a custom solar module. The method includes providing design information for application specific solar cells from a customer and processing the design information to determine at least a cell size and a cell shape. The method further includes providing a transparent substrate having a thickness, a back surface region, and a front surface region. Additionally, the method includes forming a film of photovoltaic materials sandwiched by a first conductive layer and a second conductive layer. The first conductive layer overlies the front surface region of the transparent substrate. The method further includes disposing an opaque sheet material with multiple units having the cell size and the cell shape to immediate proximity of the back surface region so that the one or more grid-line openings are projected to the front surface region to define one or more cell-boundary regions. The multiple units are separated by one or more grid-line openings with a first width. Furthermore, the method includes performing one or more processes including at least illuminating a light beam through a first region within the one or more grid-line openings to a first portion within the one or more cell-boundary regions, removing a column of the film of photovoltaic materials sandwiched by a first conductive layer and a second conductive layer over the first portion, and scanning the light beam from the first region to a second region along the one or more grid-line openings to form a channel with a second width along the one or more cell-boundary regions. The channel divides the film of photovoltaic materials sandwiched by a first conductive layer and a second conductive layer into one or more unit cells having the cell shape and the cell size and the second width is substantially the same as the first width.

In another embodiment, the method further includes configuring each of the one or more unit cells to a solar cell retaining the photovoltaic materials sandwiched by a first conductive layer and a second conductive layer. Moreover, the method includes coupling the one or more unit cells to each other by respectively interconnecting the first conductive layer and a second conductive layer in series or in parallel based on custom requirement. The method further includes assembling the coupled one or more unit cells to form a custom solar module.

In an alternative embodiment, the present invention provides a computer code for instructing manufacture of application specific solar cells. The computer code includes a section of code for processing a design information for an application specific solar cell, the design information being stored in a database. The computer code further includes a section of code for determining at least a cell size and a cell shape based on the processed design information. Additionally, the computer code includes a section of code for instructing a process of providing a transparent substrate having a thickness, a back surface region, a front surface region, and one or more grid-line regions overlying the front side surface region. The one or more grid regions are configured to provide one or more unit cells having the cell size and the cell shape. The computer code further includes a section of code for instructing a process of forming a layered structure including one or more films of photovoltaic materials overlying the front surface region of the transparent substrate. Furthermore, the computer code includes a section of code for instructing one or more processes of aligning a laser beam from the back surface region through the thickness of the transparent substrate to illuminate a first region within the one or more grid-line regions, subjecting a first portion of the layered structure overlying the first region to absorbed energy from the laser beam to separate the first portion of the layered structure from the first region, and scanning the laser beam from the first region to a second region along the one or more grid-line regions to cause formation of one or more unit cells having the cell size and cell shape. Moreover, the computer code includes a section of code for instructing a process of transferring the one or more unit cells having the cell size and the cell shape.

Depending upon the specific embodiment, one or more of these features may also be included. The present technique provides an easy to use process that relies upon conventional technology that is nanotechnology based. In some embodiments, the method may provide a thin film based solar module with higher efficiencies in converting sunlight into electrical power using a multiple junction design and method. Depending upon the embodiment, the efficiency can be about 10 percent or 20 percent or greater. Additionally, the method provides a process that is compatible with conventional process technology without substantial modifications to conventional equipment and processes. For example, a pulse laser systems with a homogenous top-hat beam profiles are readily available commercially and laser beam scanning operation can be easily controlled and automated. Depending on the film material that to be removed selectively, the laser characteristics including the wavelength, power level, pulse length and duration etc. can be adjusted accordingly. In a specific embodiment, the present method and system can also be provided using large scale and environmentally friendly manufacturing techniques, which eliminate the usage of solvent for cleaning the side surface and reduce running costs associated with the manufacture of the photovoltaic devices. In particular, the side surface the thin film photovoltaic devices exposed after laser separation process is completely cleaned without any shorting between layers of the thin film. In another specific embodiment, the present method and structure can also be provided using any combination of suitable single junction solar cell designs to form top and lower cells, although there can be more than two stacked cells depending upon the embodiment. In a preferred embodiment, the present method and system allows for design of a custom application specific solar module using application software to provide instructions for design and manufacture processes. Embodiments of the invention provide big advantages for volume manufacturing custom solar module with substantially reduced cost. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to photovoltaic materials. More particularly, the present invention provides a method and system for design and manufacture of a solar module using a laser separation process for forming one or more unit cells from continuous layered structure of photovoltaic materials. Merely by way of example, the present method and structure have been implemented to manufacture an application specific thin film solar cell having single or multi junction photovoltaic materials, but it would be recognized that the invention may have other configurations.

Figure 1:
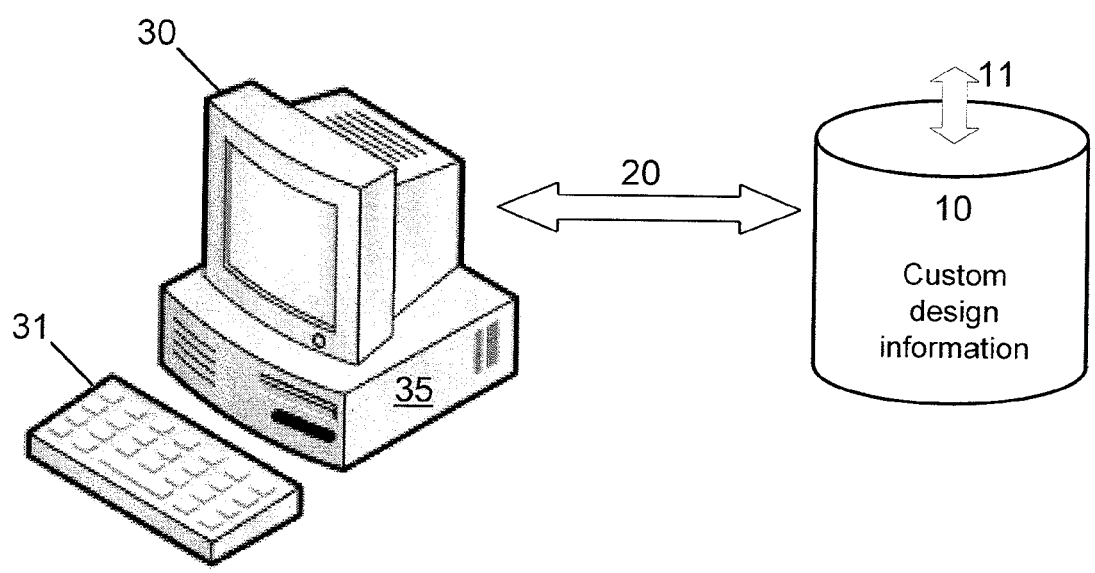
FIG. 1 is a simplified diagram illustrating a computer configured to receive a custom design information stored in a database according to an embodiment of the present invention.

FIG. 1 is a simplified diagram illustrating a computer configured to receive a custom design information stored in a database according to an embodiment of the present invention. This diagram is merely an example, which should not unduly limit the scope of the claims herein. As shown, a database 10 is established for storing a plurality of custom design information data. In one embodiment, the database 10 is linked to a computer network through at least an I/O port 11 configured to receive one or more sets of data inputted by customers. In one implementation, the database 10 may includes an expert system for managing information specific for custom solar cell and module design. For example, the information for designing application specific solar cell is custom-inputted to the database and managed by this expert system, including all design data indexed via cell size, cell shape, cell I-V characteristic, cell open circuit voltage, cell maximum power rating (voltage and current), cell short circuit current, and environmental susceptibility parameters so on. In another embodiment, a computer 30 with preloaded application software code 35 uses an application programming interface 20 to retrieve the design data stored in the database 10. The computer 30 can be any state-of-art computation system including a desktop computer, a laptop computer, a workstation linked to a central system, a virtual terminal with shared computation resources, etc. In one implementation, it has a keyboard 31 for operator to input command for updating any design requirements and executing the application software code 35 to determine certain characteristic parameters. Of course, there can be many alternatives, variations, and modifications.

Figure 1A:
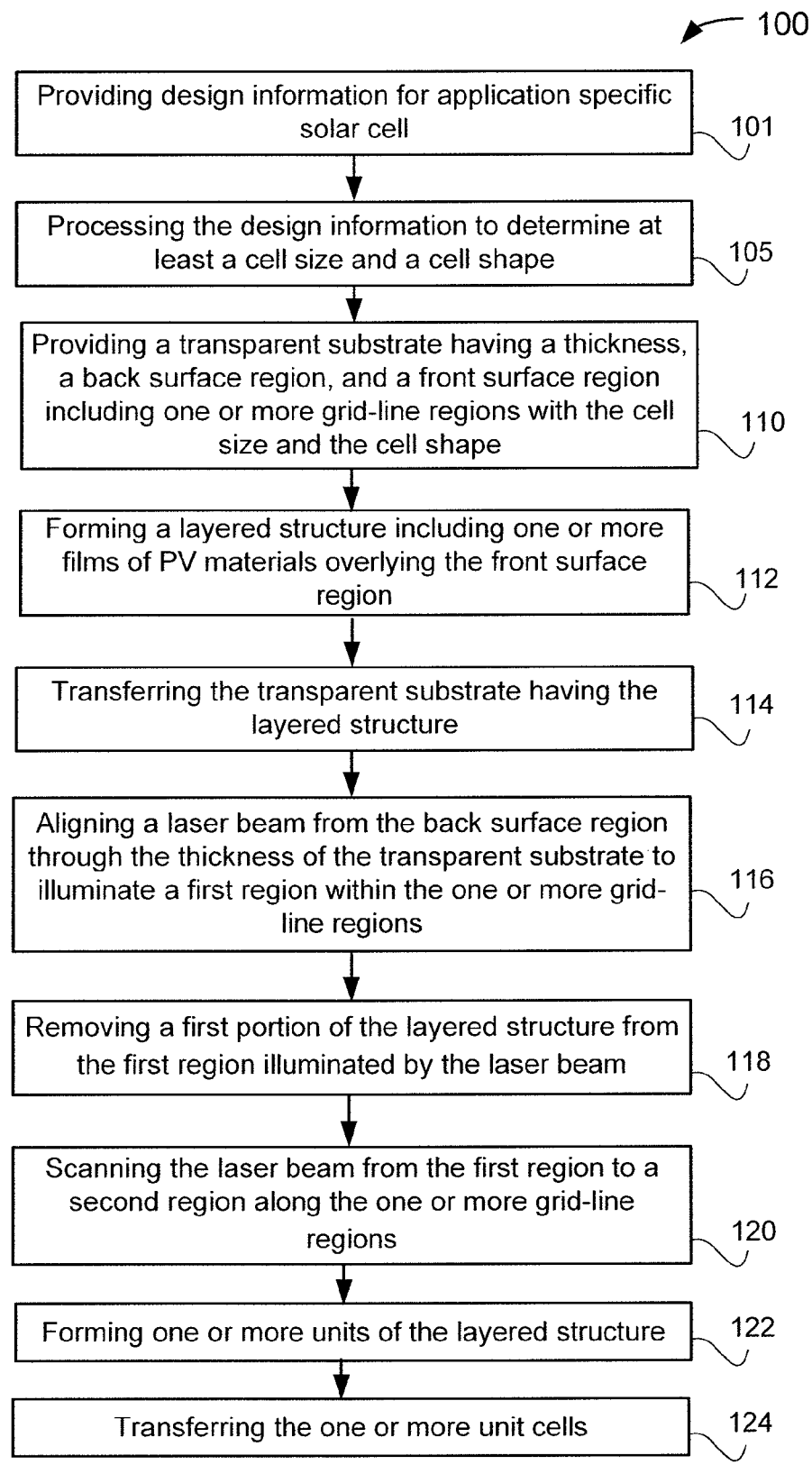
FIG. 1A is a simplified flowchart illustrating a method for forming multiple unit cells for manufacture of application specific solar cells using laser separation according to an embodiment of the present invention.

FIG. 1A is a simplified flowchart illustrating a method for forming one or more unit cells for manufacture of application specific solar cells using laser separation according to an embodiment of the present invention. This diagram is merely an example, which should not unduly limit the scope of the claims herein. The method 100 includes the following processes:

1. Process 101 for providing design information for an application specific solar cell;
2. Process 105 for processing the design information to determine at least a cell size and a cell shape;
3. Process 110 for providing a transparent substrate having a back surface region and a front surface region including one or more grid-line regions based on the cell size and the cell shape;
4. Process 112 for forming a layered structure overlying the front surface region;
5. Process 114 for transferring the transparent substrate having the layered structure;
6. Process 116 for aligning a laser beam from the back surface region through the thickness of the transparent substrate to irradiate a first region within the one or more grid-line regions;
7. Process 118 for removing a first portion of the layered structure from the first region;
8. Process 120 for scanning the laser beam from the first region to a second region along the one or more grid-line regions; and
9. Process 122 for forming one or more unit cells of the layered structure for application specific solar cell.
10. Process 124 for transferring the one or more unit cells for application specific solar cell.

The above sequence of processes provides a method of using a laser separation process from the continuous sandwiched structure of photovoltaic materials overlying an optically transparent substrate according to an embodiment of the present invention. The method is to form one or more unit cells based on received custom design information for manufacturing application specific solar cells. Other alternatives can also be provided where processes are added, one or more processes are removed, or one or more processes are provided in a different sequence without departing from the scope of the claims herein. For example, the method may include interconnecting the one or more unit cells electrically in series or in parallel based on custom requirement. The method further can include assembling the interconnected one or more unit cells to form a custom solar module. Further details of the method can be found throughout the present specification and more particularly below.

At Process 101, design information for application specific cells is provided. For example, the design information is retrieved by a computer through an application programming interface from a database that stores all desired device data including information for the application specific solar cells. In one implementation, the computer is a desktop computer 30 shown in FIG. 1 that has preloaded an application software code 35 configured to process the data retrieved from the database. The information for the application specific solar cells includes at least a cell size, a cell shape, a cell I-V characteristic, a cell open circuit voltage, a cell maximum power rating (voltage and current), a cell short circuit current, and environmental susceptibility parameters. In one embodiment, the application software code includes a section of code that is designed to interface with the database for collecting the design information.

At Process 105, the application software in the computer includes a section of code executed for processing the design information to determine at least a cell size and a cell shape based on the retrieved device data. In one implementation, the application software is a custom-made program code configured to design solar cells for custom applications. In this process, the data associated with the design information from the database is processed by the application software, with optional updates or additional inputs from operator on specific process parameters, to derive desired end-product information for application specific solar cells. The derived end-product information then can be applied in one or more processes performed later within the method 100.

Figure 2:
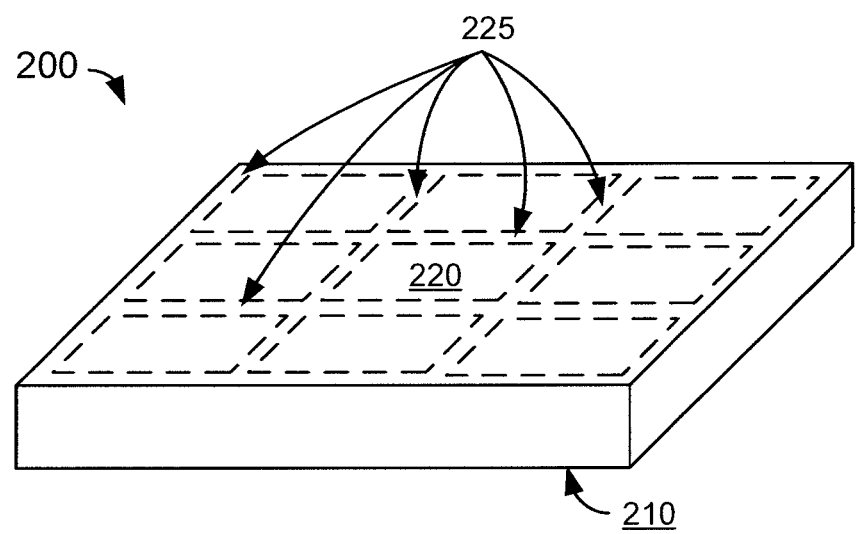
FIG. 2 is a simplified diagram illustrating a substrate provided for fabricating an application specific solar cell according to an embodiment of the present invention.

At Process 110, a transparent substrate is provided. This process can be visually illustrated by FIG. 2. FIG. 2 is a simplified diagram illustrating a substrate provided for fabricating a solar module according to an embodiment of the present invention. This diagram is merely an example, which should not unduly limit the scope of the claims herein. One of ordinary skill in the art would recognize many variations, alternatives, and modifications. As shown as a prospective view, the transparent substrate 200 includes a thickness, a back surface region 210 (not directly viewable), and a front surface region 220 (directly viewable). The front surface region 220 may be virtually divided into multiple fields by a plurality of grid-line regions 225 including a periphery edge region. In certain embodiments, the transparent substrate 200 actually is a superstrate, on which certain photovoltaic materials can be formed in different order so that the end-product is a device configured to be on top of a stacked module. Hereby the meaning of "front" or "back" is just intended for distinguish the two surfaces while not limited to specific orientation. The grid-line regions 225 are not required to be physically marked on the front surface region. In one embodiment, the specific dimensions of the grid-line regions including a width and one or more line-to-line spacing are predetermined depending on the applications. For example, the width for the grid-line regions can be ranged from about 1 mm to 20 mm or greater. The multiple fields defined by these grid-line regions thus form multiple unit cells, each at least having a certain cell size and a cell shape that has been determined within the process 105. In certain embodiments, each cell size and shape can be different though making them substantially identical to each other may have certain advantage in cell manufacture. In an alternative specific embodiment, the application software code loaded in the computer includes a section of code for instructing a process of providing a transparent substrate having a thickness, a back surface region, a front surface region, and one or more grid-line regions overlying the front side surface region, where the one or more grid regions are configured to provide one or more unit cells having the cell size and the cell shape. In one embodiment, the substrate 200 is made of material that is optically transparent. For example, the transparent substrate 200 can be a glass substrate, or an acrylic substrate, or a quartz substrate, or a fused silica substrate. In particular, the substrate material is at least transparent to lights with wavelengths ranging from about 400 nm to about 1200 nm. Of course, there can be other variations, alternatives, and modifications.

At Process 112, a layered structure including one or more films of photovoltaic materials overlying a metal layer is formed spanning spatially overlying the front surface region. In certain embodiment, the one or more films of photovoltaic materials can be made using thin film metallic oxide bearing semiconductor characteristic. In other embodiments, the one or more films of photovoltaic materials can be a thin amorphous silicon film, a poly-crystalline film, a compound semiconductor film, or a thin film with nano-structured materials.

The metal layer may act as an electrode layer for a final photovoltaic cell. In certain embodiment, the metal layer may be replaced by a transparent conductive oxide layer overlying a window layer of the final photovoltaic cell. More detailed description of forming the continuous sandwiched structure including one or more films of photovoltaic materials can be found in a commonly assigned U.S. Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007, commonly assigned, and hereby incorporated by reference herein. Of course, there can be other variations, alternatives, and modifications in the selection of the photovoltaic materials.

Figure 3:
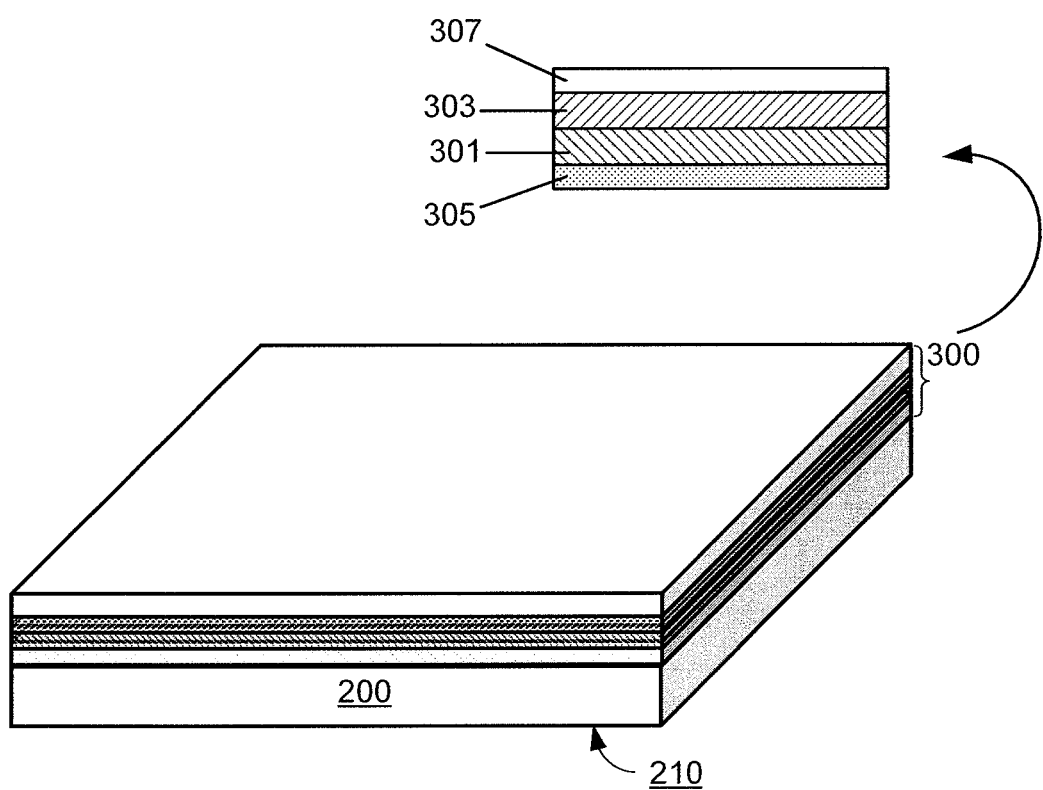
FIG. 3 is a simplified diagram schematically showing a layered structure including films of photovoltaic materials formed on the substrate according to an embodiment of the present invention.

As an illustration, FIG. 3 is a simplified diagram schematically showing a continuous layered structure including one or more films of photovoltaic materials formed overlying a metal layer which overlies the surface region of a transparent substrate according to an embodiment of the present invention. This diagram is merely an example, which should not unduly limit the scope of the claims herein. One of ordinary skill in the art would recognize many variations, alternatives, and modifications. In a specific embodiment, the application software code loaded in the computer includes a section of code for instructing a process of forming a layered structure including one or more films of photovoltaic materials overlying the front surface region of the transparent substrate. As shown in FIG. 3, the layered structure 300 is formed overlying the front surface region 220 (now being covered) of the provided transparent substrate 200. A inset side view schematically shows multiple layers of materials within the layered structure including at least a conductive layer 305 overlying front surface region 220, a P-type semiconductor layer 301 overlying layer 305, a N-type semiconductor layer 303 overlying P-type semiconductor layer 301, and a conductive layer 307 overlying the N-type semiconductor layer 303. In one embodiment, P-type semiconductor layer 301 can be a P-type impurity doped material made of silicon, or germanium, or III-V group semiconductor, or copper indium diselenide (CIS), or Copper Indium Gallium Selenide (CIGS), or Cadmium Telluride (CdTe), or metal oxide bearing semiconductor material, or nanostructure material. Overlying the layer 301, the N-type semiconductor layer 303 can be a N-type impurity doped material made of silicon, or germanium, or III-V group semiconductor, or copper indium diselenide (CIS), or Copper Indium Gallium Selenide (CIGS), or Cadmium Telluride (CdTe), or metal oxide bearing semiconductor material, or nanostructure material. In another embodiment, the conductive layer 305 and 307 each serves as an electrode layer to one or more photovoltaic cells to be fabricated. In one embodiment, the layer 305 overlying surface region 220 of a substrate can be made of a metal. In another embodiment, the layer 305 overlying a surface region of a superstate can be a transparent conductive oxide. Correspondingly, the layer 307 can be made of a transparent metal oxide. In alternative embodiments, the P-type absorber layer is selected from $CuInS_2$, $Cu(In,Al)S_2$, $Cu(In,Ga)S_2$, and others. The absorber layer is made using a suitable techniques, such as those described in U.S. Patent Application Ser. No. 61/059,253 titled "HIGH EFFICIENCY PHOTOVOLTAIC CELL AND MANUFACTURING METHOD" and filed at Jun. 5, 2008, commonly assigned, and hereby incorporated by reference herein. Of course, these are exemplary illustrations which should not unduly limit the scope of the claims herein. One of skilled in the art should be able to recognize many variations, alternatives, and modifications of the sandwiched structure of thin film or thick film photovoltaic materials for solar module.

At Process 114, the method includes transferring the transparent substrate having the layered structure according to an embodiment of the invention. After forming the layered structure 300 on the front surface region 220 of the transparent substrate 200, the whole piece of substrate including the layered structure is transferred from a film-formation processing station to a processing stage (not directly shown) of a laser separation. The substrate having the layered structure spanning on the front surface region can be as large as meter-by-meter in scale. A robot system that is configured to support the back surface regions can be used for the transferring operation. The stage for holding the substrate in the laser separation processing station is configured to support one or more regions on the back surface region 210 which directly oppose to the corresponding field regions of the front surface region 220 but leave all areas opposing to the plurality of grid-line regions 225 exposed.

At Process 116, the method 100 includes aligning a laser beam from the back surface region through the thickness of the transparent substrate to illuminate a first region within the one or more grid-line regions. In a specific embodiment, the application software code loaded in the computer includes a section of code for instructing a process of aligning a laser beam from the back surface region through the thickness of the transparent substrate to illuminate a first region within the one or more grid-line regions. In particular, the laser beam is introduced from the back surface region of the transparent substrate to facilitate removal a portion of the layered structure from the front surface region without any physical blocking. In one embodiment, the laser beam is aligned in a direction substantially vertical to the back surface region. The alignment allows a beam spot to be placed within an exposed area on the back surface region opposing to the first region on the front surface region. Further, the laser beam is configured to scan across the transparent substrate following a predetermined pattern or can be configured to tilt to an arbitrary angle relative to the back surface region depending on applications. Of course, the alignment of the laser beam from the back surface region determines the relative position on the front surface region being irradiated by the beam spot.

Figure 4:
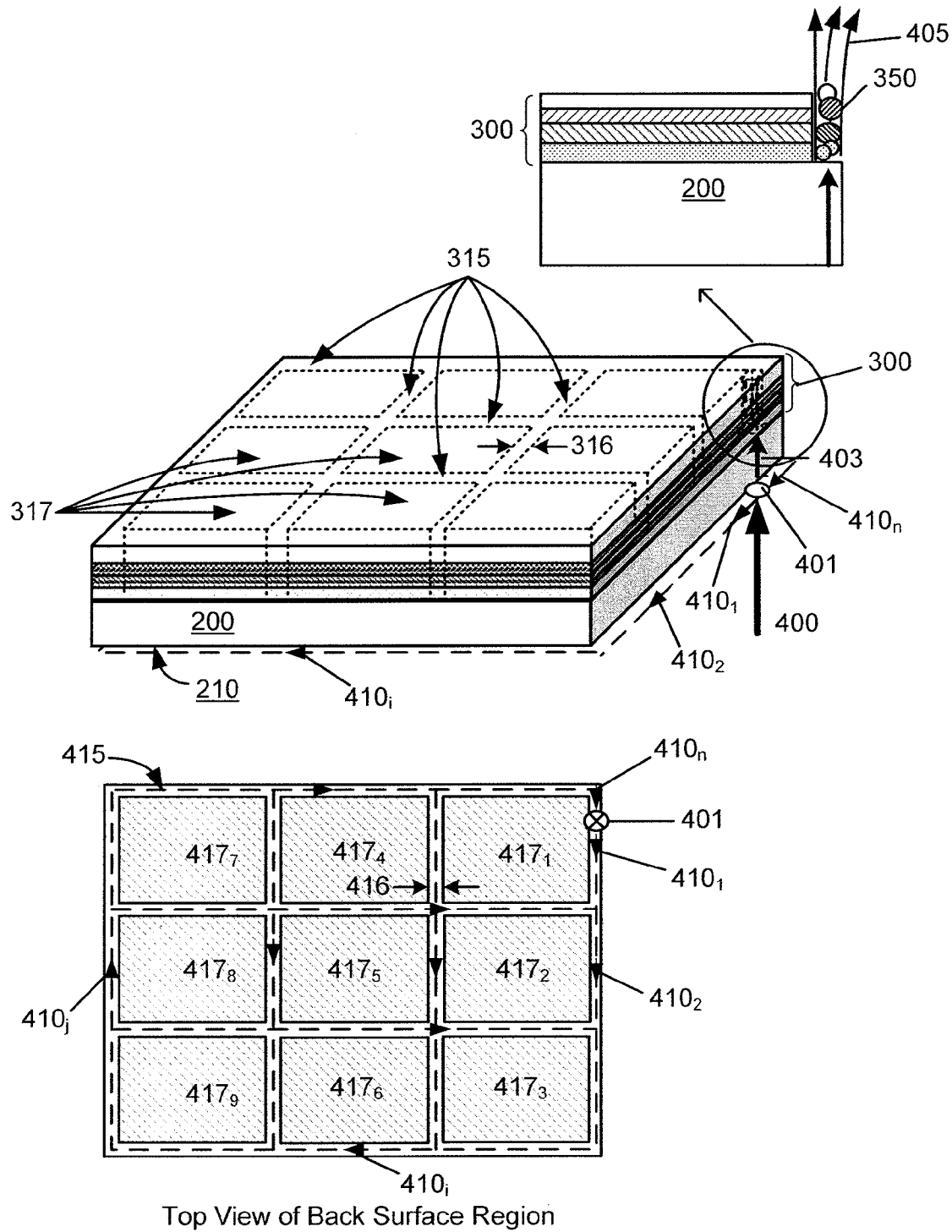
FIG. 4 is a simplified diagram illustrating a snap shot of a laser beam being aligned to irradiate at an exposed area of back surface region during a laser separation process according to an embodiment of the present invention.

FIG. 4 is a simplified diagram illustrating a snap shot of a laser beam being aligned to illuminate at an exposed area of back surface region during a laser separation process according to an embodiment of the present invention. This diagram is merely an example, which should not unduly limit the scope of the claims herein. One of ordinary skill in the art would recognize many variations, alternatives, and modifications. As shown, laser beam 400 is aligned to irradiate at a spot 401 on the back surface region 210 of the transparent substrate 200 in a direction substantially perpendicular to the back surface region. In one embodiment, the laser beam can be generated from a high power density YAG laser source. For example, a Nd:YAG pulsed laser source is used. In another example, a pulsed fiber laser is used. In particular, the laser source is a mode-locked, Q-switched Nd:YAG laser source with a pulse length varying from nanoseconds to milliseconds and a tunable pulse duration from microseconds to milliseconds. The output wavelengths, for example, for the Nd:YAG pulsed laser source can produce high powers in the infrared spectrum at 1064 nm, or can be frequency doubled to produce a green laser at about 532 nm. In a specific embodiment, the laser beam is selected to have a homogenous top-hat beam intensity profile so that the laser flux under the beam spot is substantially uniform for ablating the material with a desired edge sharpness. For example, the laser energy density of about 50 W/cm$^2$ may be substantially uniform for nearly full beam spot size of about 3 mm or bigger with a top-hat beam profile. In addition, a 50 W/cm$^2$ power density can be high enough, after penetrating through the substrate, to be absorbed by an immediate first layer of material to induce a laser separation process. In general, the laser separation process according to the present invention is tuned to selectively remove a portion of thin film materials formed on the front surface region by directing the beam directly from the back surface region. Of course, there can be other variations, alternatives, and modifications.

In a specific implementation, a Nd doped YAG pulsed laser source supplied from Edgewave GmbH, Germany is used. The laser wavelength is 1064 nm with an average power of 40 W and a pulse energy of 6 mJ at 10 kHz repetition rate and about 14 ns pulse length. The laser beam is tailored to have a 2D rectangular intensity distribution with 5:1 edge ratio and top-hat profile along both edges. The beam quality is characterized by M$^2$<2 and a beam diameter of about 5 mm at source window. The laser beam generated by the laser source has been successfully applied for structuring of photovoltaic film stacks, scribing or ablating thin film solar units, and conducting edge deletion of the thin film solar cells.

Referring to FIG. 4 again, a top view of back surface region 210 is also schematically given. As shown, a plurality of optically opaque areas labeled 417$_1$ through 417$_9$ may be covered by a non-transparent or optical opaque sheet material. In one embodiment, the optically opaque areas 417$_1$ through 417$_9$ occupy majority portion of the back surface region 210. At the same time, those exposed area 415 including a peripheral edge region as well as the strips and columns that separates the optical opaque areas 417$_1$ through 417$_9$. In one embodiment, the opaque areas is provided to ensure the laser beam 400 not to pass through while the exposed area 415 is intentionally laid out to project correspondingly to the one or more grid-line regions 225 defined on the front surface region 220. In one embodiment, the laser beam 400 has a beam spot size bigger or smaller than the predetermined width 416 of the exposed area 415. Therefore, the exposed area 415 allows the laser beam 400 at least partially to pass through the substrate and reach the one or more predetermined grid-line regions 225. As shown in FIG. 4, the laser beam 400 irradiated at the spot 401 turns into a beam 403 along a path within the transparent substrate. The beam 403, bearing substantially the same power as the beam 400, reaches a first region 405 of the front surface region directly opposed to the spot 401. The first region 405 is within the grid-line regions 225 of the front surface region 220.

At Process 118 the method includes subjecting a portion of the metal layer overlying the first region in the laser beam to separate a portion of the layered structure from the first region. In a specific embodiment, the application software code loaded in the computer includes a section of code for instructing a process of subjecting a first portion of the layered structure overlying the first region to absorbed energy from the laser beam to separate the first portion of the layered structure from the first region. In particular, the metal layer is an immediate first layer subjecting to the irradiation of the laser beam which has a wavelength adapted to be strongly absorbed by the metal layer depending on particular material. Therefore, once the portion of the metal layer is under irradiation of the laser beam 403, the energy of high power laser would be mostly converted into heat into local portion of the metal layer. Because of using the high power pulsed laser beam, the energy density becomes exceptionally high, for example as high as 50 W/cm$^2$, within a short time at least partially the heat can be transferred to a latent heat of sublimation of the portion of the metal layer without any melting. Therefore, a portion of metal layer is directly transformed from solid state into vapor. In another embodiment, the pulse length, wavelength, and the power level of the laser may be tuned to produce the desired sublimation result depending on specific material composition of the metal layer.

Additionally, at the Process 118, the sublimation of a portion of metal layer induces a rapid volume expansion around the interface vicinity of the first region under the laser beam illumination. Depending on the pulse length of the high power laser beam, in a specific embodiment, the volume expansion possess an momentum from the aligned laser beam and tends to gain its space from the neighboring material with the weakest structure strength directly above the sublimated portion of metal layer. With assistance of the pulsed laser beam, the rapid expansion of the sublimated metal layer creates a strong mechanical force within very short amount of time and can effectively break apart the material bonding of the portion of the layered structure, blowing out the portion of the layered structure directly overlying the sublimated portion of metal layer. In one embodiment, the portion of the layered structure directly overlying the sublimated portion of metal layer is completely free from the first region of the front surface region.

Referring again to the inset of FIG. 4, as the aligned laser beam 403 passes through the transparent substrate 200, a portion of metal layer under the spot is sublimed which rapidly expands to break apart the portion of the layered structure 305 directly above by the strong momentum 405 induced by the high power pulse laser. Additionally, because the laser pulse length can be adjusted to as short as nanoseconds range, the material removal process is highly selective and confined by the laser beam spot. In particular, as the laser beam intensity profile is chosen to have a homogeneous top-hat shape, the beam intensity is substantially uniform across the beam spot so that the resulted material removal for every spot-illumination also shows sharp edges. In other words, the lateral dimension of the portion of layered structure being removed by above laser separation process can be controlled with high precision to form a straight cutoff shape of a cross-sectional region around the edge of the beam spot. The edge direction can be substantially in parallel to the direction of the aligned laser beam. In another embodiment, the material removal process by the laser beam does not necessarily cause sublimation of all layers of material of the layered structure. Instead, the major portion of the layered structure is mostly broken into small particle or dust and blown away by the strong mechanical force generated during the rapid volume expansion of a small portion of metal layer. These particles or dusts can be easily sucked up by a vacuum head pre-disposed nearby, leaving behind the cleaned first region and cross-sectional regions. In yet another embodiment, with properly optimized laser separation process and configuration of the vacuum head (not shown in FIG. 4), the cross-section region formed in the above controlled laser separation process is found substantially free of any residues of the removed portion of the layered structure.

Additionally the method 100 includes a process of scanning the laser beam from the first region to a second region along the one or more grid-line regions (Process 120). In an alternative embodiment, the application software code loaded in the computer includes a section of code for instructing a process of scanning the laser beam from the first region to a second region along the one or more grid-line regions to cause formation of one or more unit cells having the cell size and cell shape. As shown in FIG. 4, the laser beam 400 is generated by a laser source (not shown) having one or more mirrors configured to redirect the beam from a first spot to a second spot along various paths of the exposed areas 415. In another embodiment, the laser beam 400 itself can be fixed in position while the substrate 200 supported by a sample stage can be operably moved to allow the laser beam 400 scanning relatively from the first spot to a second spot along various pathways of the exposed area 415. As shown in FIG. 4, the dashed line represents the laser beam scanning path and a plurality of arrows $410_1$, $410_2$, $410_i$, $410_j$, and $410_n$ each represents an instant beam spot during the scanning procedure. For example, the laser beam 400 is scanned from a first spot location $410_1$ to a second spot location $410_2$, and so on. In a specific embodiment, the scanning procedure includes moving a plurality of isolated beam spots step by step. Each of the plurality of isolated beam spots is overlapped by about 10-15% with a immediate next of the plurality of isolated beam spots. At each step, the beam spot is under illumination within a time of a predetermined pulse length of the laser. Then it shifts to the next step within a time of a pulse duration of the laser followed by another illumination at the next step. The laser scanning rate is one of process parameter and can be synchronized with the pulse laser characteristics. It can be predetermined and adjustable depending on the specific material composition of the layered structure to be removed.

At every spot along with any scanning path, the laser beam 400 passes from the back surface region through the thickness of the substrate 200. For example, the laser beam 400 passes from a first spot on the back surface region into the media of the transparent substrate 200 and turns to a beam 403 reaching a first region of the front surface region from inner side. Further it is scanned from a first region to a second region along the one or more grid-line regions 225. In other words, the first region and the second region irradiated by the beam 403 are respectively opposed to the first spot and the second spot of the beam 400. As the Process 120 is in progress the film materials of the portion of the layered structure illuminated by the beam 403 are selectively removed by the laser beam using Process 118 and 120. In one example, the laser beam 400 is scanned a whole loop of the exposed edge area 415 from the first spot location $410_1$, through $410_2$ to $410_n$ and finally returned the starting location $410_1$. In such a process, the whole peripheral edge portion of the layered structure 300 are selectively removed. Of course, there can be many variations, alternatives, and modifications.

In another process, the laser beam is scanned along the predetermined one or more grid-line regions 225, which can be defined by projecting the grid-line openings of the optical opaque sheet material disposed at the immediate proximity on the back surface region, across the whole layered structure 300 on the substrate 200 to remove a width of film materials. As a result, FIG. 4 also schematically illustrates that multiple channels 315 with a width 316 in a row/column grid-line pattern are formed within the layered structure 300 to separate the layered structure into multiple unit cells 317. In a specific embodiment, the width 316 of these channels is determined by the beam spot and beam profile as well as the scanning routing. For example, the width 316 of those channels can be substantially equal to the predetermined width of the one or more grid-line regions on the front surface region 220 which is indirectly defined by a vertical projection from the width 416 of the grid-line openings associated with the back surface region 210. The remaining portion of the layered structure 300 are still composed by one or more films of photovoltaic materials overlying the remaining portion of the metal layer and are now divided by the channels 315. As shown, each cell 317 located on a portion of front surface region 220 opposes to a corresponding portion of the optically opaque sheet material 417 associated with the back surface region 210 of the substrate 200.

Figure 5:
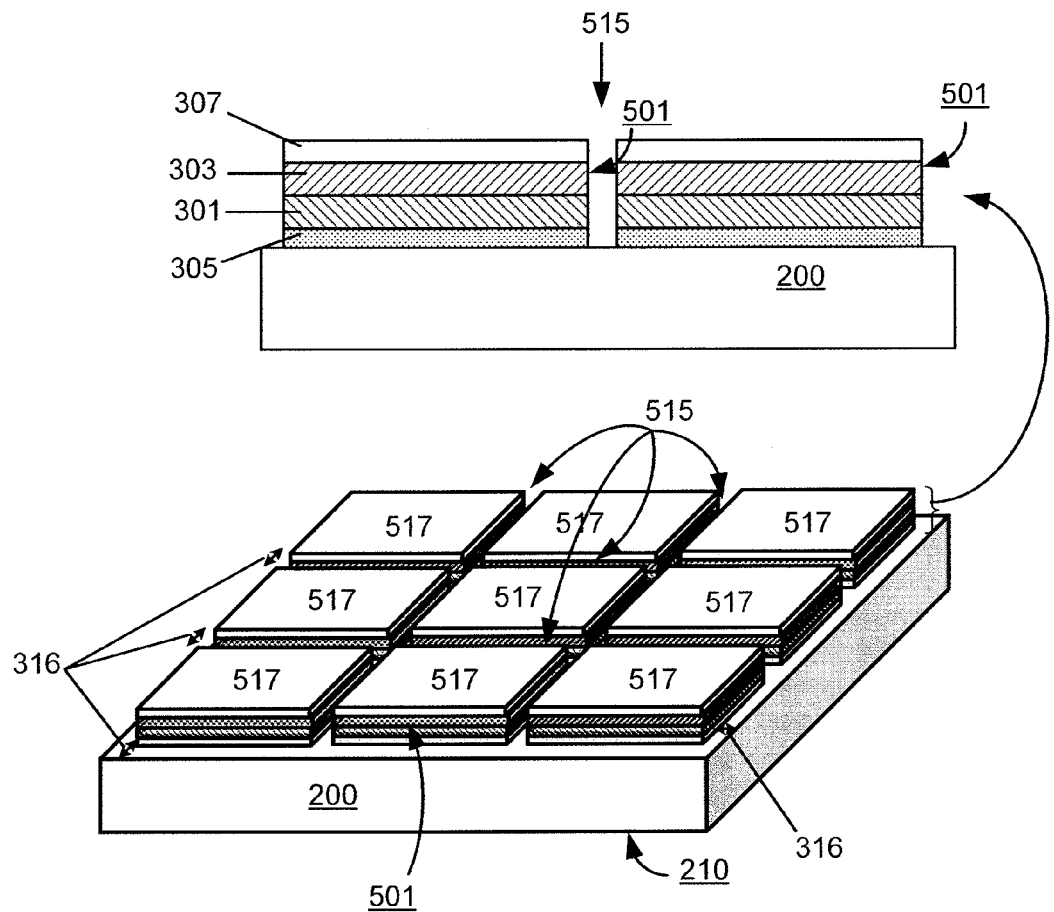
FIG. 5 shows a simplified diagram illustrating multiple unit cells formed from the layered structure by a laser separation process according to an embodiment of the present invention.

FIG. 5 shows a simplified diagram illustrating multiple unit cells formed from the layered structure by a laser separation process according to an embodiment of the present invention. This diagram is merely an example, which should not unduly limit the scope of the claims herein. One of ordinary skill in the art would recognize many variations, alternatives, and modifications. As shown, the laser separation process mentioned in last paragraph has removed a width of the layered structure within the portion 315, which becomes one or more channels or trenches 515 cutting the layered structure down to the front surface region 220. Naturally, these one or more channels 515 act as boundary regions of one or more unit cells 517 of the layered structure. A side view also shows in more detail of the unit cell structure after the laser separation process is performed on both edge region and inner grid-line region. In a specific embodiment, each channel exposes a portion of the front surface region 220 and is sided with one or more cross-sectional region 501. The cross-sectional region 501 exposes every layers of the layered structure including the one or more films of the photovoltaic materials sandwiched by a metal layer beneath and another conductive layer on top. For example, as shown in the side view of FIG. 5, the cross-sectional region 501 reveals the metal layer 305, a P-type semiconductor layer 301, a N-type semiconductor layer 303, and a transparent conductive oxide layer 307. In case of making a top cell based on a superstrate, the metal layer 305 should be configured to be transparent for sun light but relative opaque relative to the wavelength of the scanned laser beam. In certain embodiments, the laser separation process is capable to provide the exposed portion of the front surface region 220 substantially free of residues of removed film materials during the laser separation process. Additionally, the laser separation process is capable to provide the cross-sectional region 501 substantially free of residues of removed film materials which otherwise may cause conductive shorting between the layers resulting failure or damage to the solar device. In other words, the one or more unit cells 517 possess all device functionalities after laser separation from the continuous layered structure.

At Process 122, the method 100 includes forming one or more unit cells of the layered structure. Essentially, the multiple unit cells 517 formed in the laser separation process (including at least the process 118 and the process 120) to cut the layered structure 300. Additionally, the laser separation process plus any associated vacuum cleaning process remove any residue of film materials from the cross-section region to prevent from any shorting between the layers. The layered structure includes one or more P-N junctions among the one or more films of photovoltaic materials and includes at least one electrode layer made by a metal layer and another electrode layer made by a transparent conductive oxide layer. All the layers exposed at the cross-section region are substantially free of layer-shorting residue particles. Therefore, each unit cell 517 produced by the method 100 retains all the layered photovoltaic structures and by itself is capable of forming one solar cell.

Depending on the applications, the method further includes Process 124 for transferring one or more unit cells for manufacture of application specific solar cells. In a specific embodiment, the application software code installed in the computer includes a section of code for instructing a process of transferring the one or more unit cells having the cell size and the cell shape. For example, the transferred one or more unit cells, each of which has the cell size and cell shape according to custom-inputted design information, can be packaged into or integrated with other devices or products to form a custom solar module. Each unit cell here serves an independent solar cell. In another example, the thin film photovoltaic unit cell can be implemented to a building material surface which can be used to build high energy efficient buildings from sky scraper to single family home. Since the laser separation process completely reveals the electrode layers (for example layer 305 or layer 307) in the cross-section region 501 and cleans the cross-section region substantially free of layer-shorting residues of removed film materials, one or more electric connectors can be selectively inserted within the one or more channels or trenches 515 to couple to the one or more electrode layers. In another embodiment, Process 122 may also include coupling one unit cell with another electrically in series or in parallel to manufacture flexible solar module for different applications.

Figure 6:
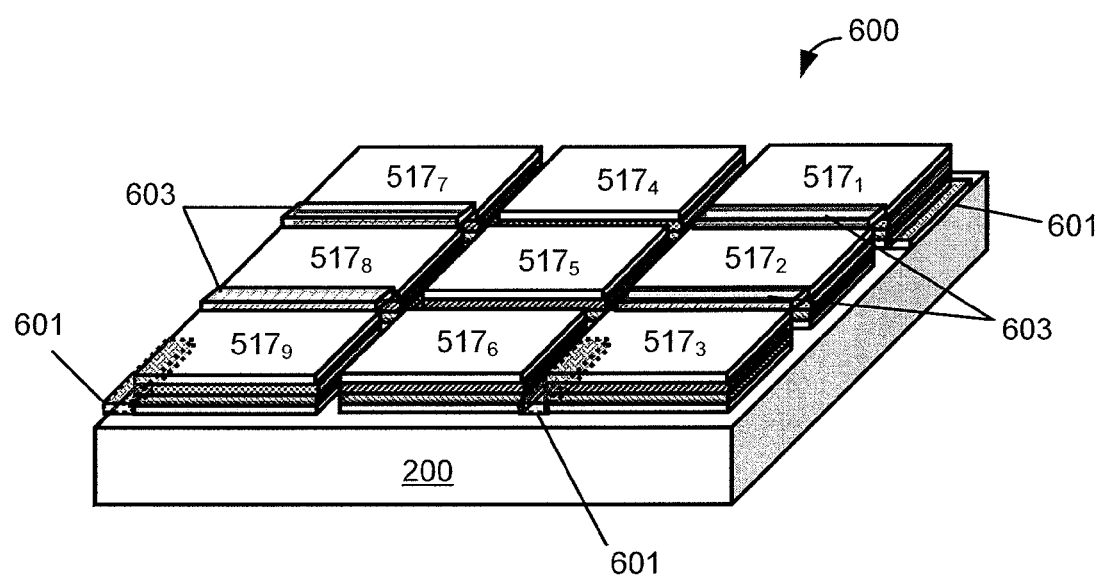
FIG. 6 shows an exemplary solar module including multiple unit cells cross coupled with electric connectors according to an embodiment of the present invention.

For example, FIG. 6 shows an exemplary solar module including multiple unit cells interconnected with electric connectors according to an embodiment of the present invention. As shown, the solar module 600 includes multiple unit cells ($517_1$ through $517_9$) provided on a substrate 200. For example, each of the multiple unit cells $517_1$ through $517_9$ are made from the cell 517 formed in Process 118. The solar module includes an electric connector 601 for coupling an electrode layer of one unit cell $517_1$ on the upper right corner to either a neighboring unit cell within the solar module or another unit cell of a separate solar module. The whole right column of unit cells ($517_1$ through $517_3$), as shown, is coupled electrically in parallel by one or more connectors 603. Similarly, other columns of unit cells, $517_4$ through $517_6$ or $517_7$ through $517_9$, can also be coupled electrically in parallel by additional connector 603. While the column to column coupling can be in series by additional connectors 601. Of course, there can be many variations, alternatives, and modifications in the coupling order, configuration, and connector type for manufacture of the solar module using a plurality of unit cells provided in Process 122.

Figure 7:
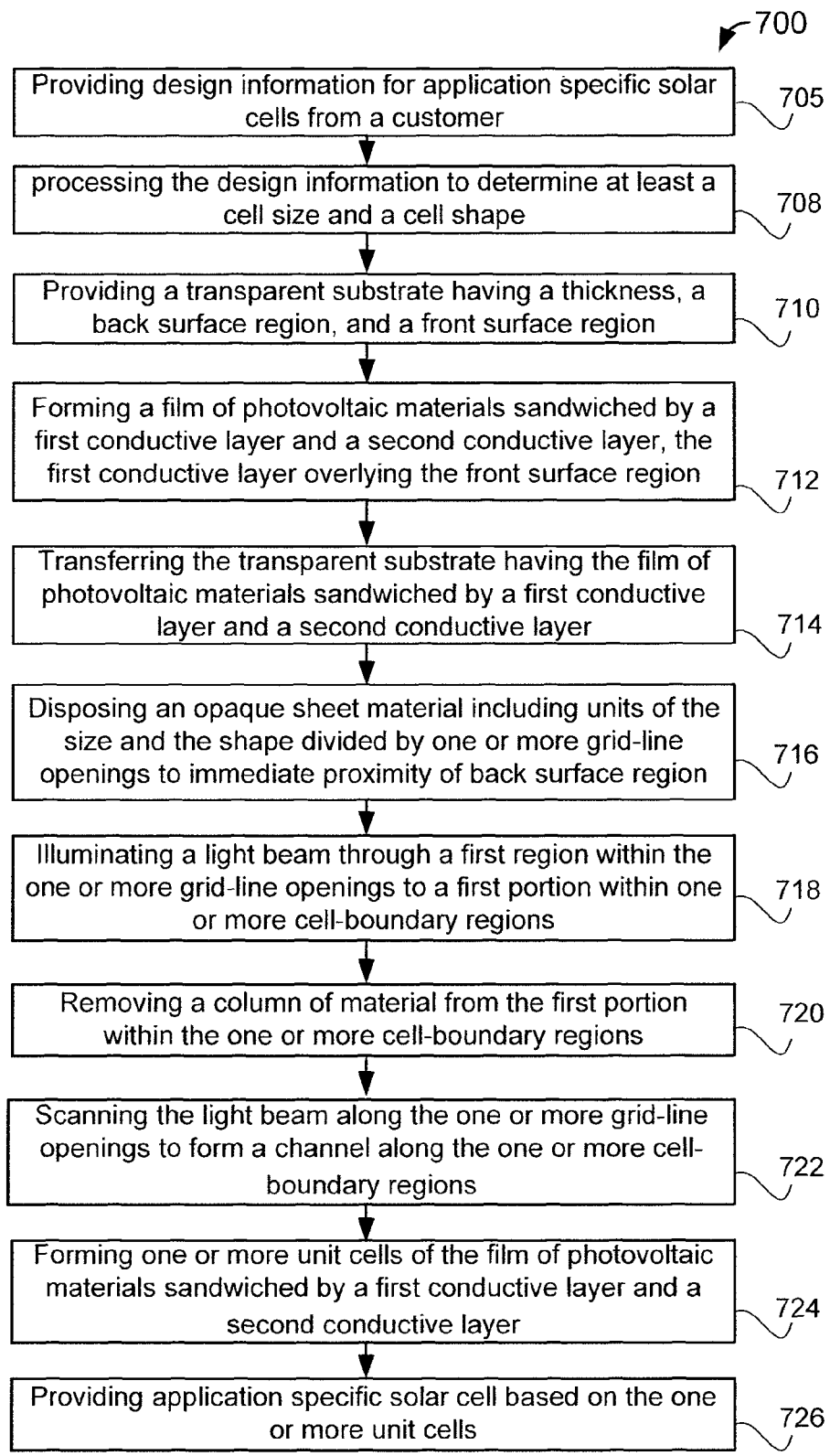
FIG. 7 is a simplified flowchart illustrating a method for manufacture custom solar cells according to an alternative embodiment of the present invention.

FIG. 7 is a simplified flowchart illustrating a method for manufacture a custom solar module according to an alternative embodiment of the present invention. This diagram is merely an example, which should not unduly limit the scope of the claims herein. The method 700 includes providing design information for application specific solar cells from a customer (705) and processing the design information to determining at least a cell size and a cell shape (708). For example, these processes are performed by executing a computer software code to retrieve data stored in a database. The data contains application specific solar cell information inputted by a customer or updated by an operator. Running the software code can determine at least a desired cell size and shape in association with a plurality of other specifications for the application specific solar cell, such as a cell I-V characteristic, a cell open circuit voltage, a cell maximum power rating (voltage and current), a cell short circuit current, and environmental susceptibility parameters so on. Furthermore, the method includes a process of providing a transparent substrate having a thickness, a back surface region, and a front surface region (710). For example, the transparent substrate can be the substrate 200 shown in FIG. 2 that may be transparent at wavelength ranging from 400 nm to 1200 nm. For example, the transparent substrate can be made of glass, or acrylic, or quartz, or fused silica or similar materials.

Additionally, a film of photovoltaic material sandwiched by a first conductive layer and a second conductive layer is formed spanning spatially overlying the front surface region (712) of the substrate. The first conductive layer directly overlying the front surface region can be a metal layer. This process can be substantially the same as the process 112 including forming the film of photovoltaic material within the layered structure 300 shown in FIG. 3.

The transparent substrate having the film of photovoltaic material sandwiched by a first conductive layer and a second conductive layer is then transferred (714) depending on the applications. For example, this process may involve relocating the transparent substrate having the film of photovoltaic material sandwiched by a first conductive layer and a second conductive layer to a proper working stage or a processing chamber from the film formation (or growth) chamber. The method 700 further includes disposing an opaque sheet material including geometrically structured units having the cell size and the cell shape deduced in process 708 and divided by one or more grid-line openings with a cell spacing. Depending on applications, the cell spacing can be in a range from 1 mm to about 20 mm and more. The opaque sheet material can be a thin film or foil made of metal. In an embodiment, the opaque sheet material is intended to block at least a light beam that is optically transparent to the transparent substrate. For example, the opaque sheet material at least stops light at a wavelength between about 400 nm and about 1200 nm. The process 716 causes the one or more grid-line openings to be projected (in certain embodiment, in a substantially vertical direction) from the back surface region to the front surface region so that one or more cell-boundary regions are defined with a width substantially the same as the cell spacing. For example, the defined cell-boundary regions can be the same as the grid-line regions 225 shown in FIG. 2.

Additionally, the method 700 includes a process 718 for illuminating a light beam through a first region within the one or more grid-line openings to a first portion within the projected one or more cell-boundary regions. In one embodiment, the light beam is a high powered laser beam generated from a mode-locked pulse laser source. The light beam is outputted from a laser source disposed near the back surface region and is aligned towards the first region within the one or more grid-line openings. In certain embodiment, the light beam is aligned in a direction substantially perpendicular to the back surface region. For example, the laser source can be a mode-locked Q-switched Nd:YAG laser source characterized by a (maybe frequency doubled) wavelength ranging from about 400 nm to about 1200 nm, a pulse length ranging from nanoseconds to milliseconds, an energy density of about 50 W/cm$^2$, and a homogeneous top-hat intensity profile. Of course, there are many alternatives, variations, and modifications. The light beam can have a beam spot size bigger than the designed width of the grid-line openings within the optical opaque sheet material so that only partial beam may pass through the grid-line openings and further through the thickness of the transparent substrate. In another case, the beam spot size can be smaller than the designed width of the grid-line openings so that the beam needs to be scanned around to cover full width of the grid-line openings. In a specific implementation, a Nd doped YAG pulsed laser source supplied from Edgewave GmbH, Germany is used. The laser wavelength is 1064 nm with an average power of 40 W and a pulse energy of 6 mJ at 10 kHz repetition rate and about 14 ns pulse length. The laser beam is tailored to have a 2D rectangular intensity distribution with 5:1 edge ratio and top-hat profile along both edges. The beam quality is characterized by $M^2<2$ and a beam diameter of about 5 mm at source window. The laser beam generated by the laser source has been successfully applied for structuring of photovoltaic film stacks, scribing or ablating thin film solar units, and conducting edge deletion of the thin film solar cells. In another specific implementation, the laser ablation or edge deletion of the thin film solar material can be replaced by a method of mechanical scribing using one or more stylus blade moving across the substrate.

Referring to FIG. 7 again, the method 700 includes a process 720 for removing a column of material from the first portion within the one or more cell-boundary regions. In particular, the light beam energy (in certain embodiment it is the laser power), after passing through the transparent substrate and reaching the first portion of the cell-boundary region within the front surface region, can be absorbed firstly by the first conductive layer immediately overlying the first portion. In one embodiment, the first conductive layer overlying the first portion, usually a metal layer with a strong absorbance band associated with the wavelength of the laser, can be heated in a very short time by the absorbed pulse laser energy. The generated heat, at least partially is converted into latent heat of sublimation of the first conductive layer. Subsequently, the portion of the first conductive layer is sublimated or vaporized. The vaporized portion would rapidly expand its volume and, assisted by the aligned laser beam, creates a strong mechanical force to break bonding of materials within the layered structure.

In one embodiment, a column of material, including the first conductive layer, the film of photovoltaic material, and the second conductive material, over the first portion is removed or simply blown away from the first portion of the cell-boundary region within the front surface region. In another embodiment, the column of material is broken apart into small pieces, particles, or dusts blown out of the continuous layered structure from the substrate, leaving behind a void column with a bottom part and a surrounding side wall. The bottom part exposes the substrate and the side wall exposes a cross-sectional region of the remaining portion of the film of photovoltaic material sandwiched by the first conductive layer and the second conductive layer. This concludes a laser separation process, which can be further repeatedly performed. In one embodiment, the laser separation process is capable of freeing a column of material from the front surface region leaving behind the exposed bottom part and side wall substantially free of residues from the freed column of material. In yet another embodiment, a vacuum head can be placed over the second conductive layer to suck out the blown out dusts or any residue particles from the column of material. Because the high-power laser has a top-hat beam intensity profile over the whole beam size, the mechanical force generated in the laser separation process is highly-directional in parallel to the aligned laser beam so that the size of the resulted void column is substantially equal to the first region illuminated by the laser beam spot.

Moreover, the method 700 includes a process (722) of scanning the light beam along the one or more grid-line openings to form a channel along the one or more cell-boundary regions. Scanning the light beam essentially is repeatedly performing the laser separation process at a subsequent location following the movement of the light beam. Scanning the light beam can adjust the scanning speed based on the characteristics of the selected laser beam as well as the optical properties of materials to be removed. In particular, the laser beam intensity profile is a critical factor to determine how much overlapping fraction for each illumination spot should be relative to an immediate last illumination spot before the laser beam scans or shifts. The beam spot size also affects the scanning routines for achieving a desired width of channel or trench by connecting a plurality of removed portions of layered structure, each being a void column formed by each beam illumination spot. Usually, a 10-15% overlapping of the beam spot from step to step during the scanning is used. In one embodiment, the laser illumination and scanning routines can cover the cell spacing of the grid-line openings so that a channel with a width can be formed along the projected cell-boundary regions. The width of the channel or trench is substantially equal to the cell spacing of the grid-line openings if the laser beam with top-hat beam profile is well aligned in the vertical direction to the back surface region. For example, one or more channels with a width ranging from about 1 mm to about 20 mm and more can be formed by the laser separation process. In one example, the one or more channels or trenches formed are substantially similar to the trenches 515 shown in FIG. 5. In one embodiment, the laser illumination and scanning also is performed along a full pattern of the grid-line openings to selectively remove the layered structure to form all the channels along the projected cell-boundary regions.

In a specific embodiment, the scanning process can be performed by controlling a mirror to guild the movement of the beam. In another embodiment, the scanning process can be performed by using a robot system to drive the stage that holds the substrate relative to a fixed laser beam. The stage movement allows the laser beam to irradiate at a first region within the grid-line openings and to move from the first region to a second region in a predetermined scanning procedure (with a planned pathway, spot coverage, and scanning speed). In a specific embodiment, the scanning process is operated to allow the beam to irradiate within grid-line openings from a first region to a second region. Depending on the specific film material property, provided grid pattern, and selection of the pulsed laser source, one can precisely control the dimension of ablated portion within the layered structure.

In one embodiment, the method 700 further includes a Process 724 for forming one or more unit cells of the film of photovoltaic materials sandwiched by a first conductive layer and a second conductive layer. In a specific embodiment, the one or more channels formed in Process 722 expose a portion of front surface region and also create one or more cross-sectional regions of the remaining portion of the materials. In one embodiment, the exposed portion of the front surface regions maps with the cell-boundary regions defined in Process 716. In another embodiment, the cross-sectional regions retain all layers of the materials formed in Process 712. In yet another embodiment, the cross-sectional region formed using the method 700 has a straight-edge shape substantially vertical to the substrate. The laser separation process can be tuned to form the one more channels with substantially free of residue particles therein. In one embodiment, a vacuum head can be applied and disposed above the layered structure subjecting to the laser separation process. As a result, nearly all the residues from the blown out materials or dusts during the laser separation process can be immediately sucked away to leave a cleaned local region within each laser illumination spot. After all, each channel along the one or more cell-boundary regions have an exposed portion of the front surface region substantially free of residue particles and side walls also substantially free of residue particles. This is important because any residue particles falling on the cross-sectional region may cause electrical shorting or other damage to device.

Subsequently, one or more unit cells are formed with each of them being separated by the one or more channels along the one or more cell-boundary regions. As shown in FIG. 5, when the one or more channels are formed by the laser separation process (and associated cleaning process), multiple unit cells 517 having the cell size and the cell shape determined in Process 708 are formed. In a specific embodiment, each unit cell includes essentially the same layers of materials including the film of photovoltaic materials sandwiched by the first conductive layer and the second conductive layer, and a peripheral cross-sectional region free of any residues. Therefore, each unit cell by itself is capable of serving as a solar cell.

Finally, the method 700 includes a process 726 for providing application specific solar cell based on the one or more unit cells. In this process, each of the one or more unit cells formed at the process 724 may be transferred out of the substrate to serve as an application specific solar cell. In one implementation, one or more unit cells can be electrically coupled to each other to form a custom solar module. One or more electric connectors may be inserted into the channels or trenches between the one or more unit cells. These electrical connectors are substantially patterned thin film structures formed within part of the Process 712. Some electrical connectors are separately installed to couple either the first conductive layer or a second conductive layer. For example, the coupling mechanism s can be electrically in series or electrically in parallel among the one or more unit cells based on custom module requirement for desired operation I-V characteristics (such as open-circuit voltage or short-circuit current) and mechanical specifications. Furthermore, the electrically interconnected on or more unit cells can be assembled following the mechanical specifications. The formation of the custom solar module according to the above processes by integrating application specific solar cells provide an advance technique for volume manufacturing thin film photovoltaic device for various specific applications. For example, the solar module based on this technology may be applied to various types of surfaces including a whole outer surface of a building. It also provides a method for large scale manufacture of custom solar devices with substantially low cost.

Figure 8:
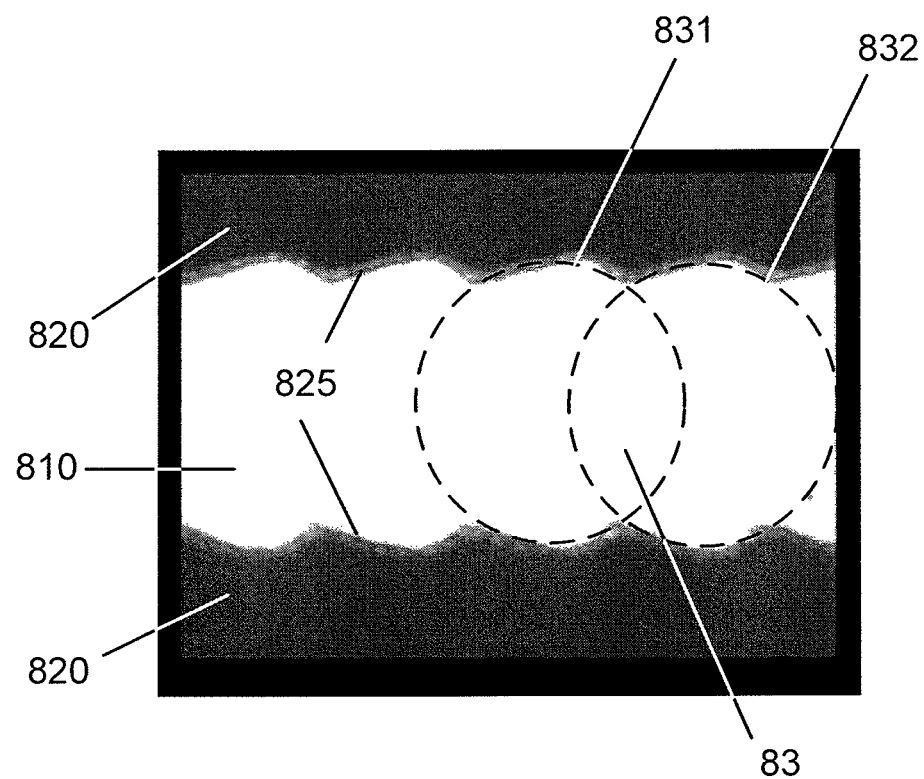
FIG. 8 is an exemplary optical microscope image of a channel formed in a thin film device by a laser separation process according to an embodiment of the present invention.

FIG. 8 is an exemplary optical microscope image of a channel formed in the thin film device by laser separation according to an embodiment of the present invention. This diagram is merely an example, which should not unduly limit the scope of the claims herein. One of ordinary skill in the art would recognize many variations, alternatives, and modifications. As shown, a channel 810 (bright color region) is formed by the laser separation process as a laser beam scans in one direction step by step across the thin film device 820 (dark color region) from the back surface region of the transparent substrate. Within the channel 810, the thin film material has been substantially removed from the transparent substrate, making it fully bright as illuminated by the microscope light. Beyond two edges 825, the thin film materials 820 remain intact (and opaque to the microscope illumination light) without any sign of crack and residual particle decoration, as evidenced by the sharp contrast of the edges. The two dashed circles 831 and 832 is schematically indicate the two subsequent beam spots during the scanning. For example, the beam scanning speed is about 4 meters per second. At each spot, the power up to 20 W laser irradiation is on with a pulse frequency of about 125 kHz. As shown, an overlapping region 83 has an estimate 20% population of each beam size (the beam diameter is about 3 mm). Of course, there can be many alternatives, variations, and modifications. For example, such scanning laser beam spots can be placed within the grid pattern preselected for manufacturing the multiple unit cells. A sequential two dimensional laser scanning can create desired patterns with desired widths as the boundary regions of the unit cells out of the continuous thin film on the substrate.

It is also understood that the examples and embodiments described herein are for illustrative purposes only and that various modifications or changes thereof will be suggested to persons skilled in the art. For example, embodiments according to the present invention have been specifically described for manufacture of application specific solar cells using a laser separation process to provide one or more thin film unit cells from a continuous thin film device based on custom design information. But, ordinary skilled in the art should recognize that many variations of the thin film photovoltaic device structures can be still applied by the present invention. Additionally, embodiments of the invention can be applied to a much broader field other than the large scale fabrication of solar module. Various modifications and changes can be included within the spirit and purview of this application and scope of the appended claims.

What is claimed is:

1. A solar cell processing system comprising:
one or more processors; and
memory communicatively coupled with an readable by the one or more processors and having stored thereon processor-readable instructions, which when executed by the one or more processors cause the one or more processors to:
process design information for an application specific solar cell, the design information being stored in a database accessible to the one or more processors;
determine at least a cell size and a cell shape based on the processed design information;
form a layered structure including one or more films of photovoltaic materials overlying the front surface region of a transparent substrate having a thickness, a back surface region, a front surface region, and one or more grid-line regions overlying the front side surface region, the one or more grid regions being configured to provide one or more unit cells having the cell size and the cell shape;
align a laser beam from the back surface region through the thickness of the transparent substrate to illuminate a first region within the one or more grid-line regions,
subject a first portion of the layered structure overlying the first region to absorbed energy from the laser beam to separate the first portion of the layered structure from the first region,
scan the laser beam from the first region to a second region along the one or more grid-line regions to cause formation of one or more unit cells having the cell size and cell shape; and
transfer the one or more unit cells having the cell size and the cell shape.

2. The solar cell processing system of claim 1 wherein the transparent substrate comprises a material made of glass, or acrylic, or quartz, or fused silica being transparent at least to the laser beam.

3. The solar cell processing system of claim 1 wherein the laser beam comprises an output from a Q switched mode locked Nd:YAG laser source and characteristics of a wavelength ranging from about 400 nm to about 1200 nm, a homogeneous top-hat beam intensity profile, and energy density of about 50 W/cm$^2$.

4. The solar cell processing system of claim 3 wherein the Nd:YAG laser source is a pulsed laser source with a pulse length ranging from nanoseconds to milliseconds and a pulse duration ranging from microseconds to milliseconds.

5. The solar cell processing system of claim 1 wherein subjecting a portion of the metal layer overlying the first region to absorbed energy from the laser beam to separate a first portion of the layered structure from the first region comprises:
converting absorbed energy from the laser beam by the portion of the metal layer at least partially into latent heat of sublimation;
breaking the first portion of the layered structure free from the first region;
forming a cross-sectional region of remaining portion of the layered structure along a direction substantially parallel to the laser beam; and
wherein the first region and the cross-sectional region are substantially free of residues of the first portion of the layered structure.

6. The solar cell processing system of claim 1 wherein one or more films of photovoltaic materials comprise single crystal silicon, or poly-crystal silicon, or amorphous silicon, semiconducting metallic oxides, or compound semiconductor including CuInS$_2$, Cu(In,Al)S$_2$, Cu(In,Ga)S$_2$, copper indium diselenide (CIS), or Copper Indium Gallium Selenide (CIGS) or Cadmium Telluride (CdTe), or nano-structured materials.

7. The solar cell processing system of claim 1 wherein scanning the laser beam comprises moving the laser beam in a step-by-step manner so that the laser beam at each step illuminates a first spot within a time equal to a laser pulse length, thereafter moves to a next step within a time equal to a pulse duration to illuminates a second spot, the second spot being spatially overlapped with the first spot at least by 10-15%.

8. The solar cell processing system of claim 1 wherein scanning the laser beam from the first region to a second region along the one or more grid-line regions comprises removing a plurality of portions of the layered structure by the laser beam, the plurality of portions of the layered structure including at least the first portion and being connected from the first region to the second region to cause a formation of one or more channels along the one or more grid-line regions, thereby forming one or more unit cells of the layered structure divided by the one or more channels.

9. The solar cell processing system of claim 8 wherein the one or more channels exposes a portion of the front surface region and cross-sectional regions of remaining portion of the layered structure, wherein the exposed portion of the front surface region and cross-sectional regions of remaining portion of the layered structure are substantially free of residues of the removed portion of the layered structure.

10. The solar cell processing system of claim 9 wherein the one or more channels comprises cell-to-cell spacing ranging from about 1 mm to about 20 mm and more.

11. The solar cell processing system of claim 1 wherein transferring the one or more unit cells further comprises electrically coupling the one or more unit cells to each other in series or in parallel.

12. The solar cell processing system of claim 11 wherein transferring the one or more unit cells further comprises assembling the coupled one or more unit cells to form a custom solar module.

* * * * *